(12) United States Patent
Yuan et al.

(10) Patent No.: US 8,546,850 B2
(45) Date of Patent: Oct. 1, 2013

(54) SUPERJUNCTION COLLECTORS FOR TRANSISTORS AND SEMICONDUCTOR DEVICES

(75) Inventors: Jiahui Yuan, Atlanta, GA (US); John D. Cressler, Smyrna, GA (US)

(73) Assignee: Georgia Gech Research Corporation, Atlanta, GA (US)

( * ) Notice: Subject to any disclaimer, the term of this patent is extended or adjusted under 35 U.S.C. 154(b) by 0 days.

(21) Appl. No.: 13/148,912

(22) PCT Filed: Apr. 8, 2010

(86) PCT No.: PCT/US2010/030367
§ 371 (c)(1),
(2), (4) Date: Aug. 10, 2011

(87) PCT Pub. No.: WO2010/118215
PCT Pub. Date: Oct. 14, 2010

(65) Prior Publication Data
US 2011/0309412 A1      Dec. 22, 2011

Related U.S. Application Data

(60) Provisional application No. 61/168,017, filed on Apr. 9, 2009.

(51) Int. Cl.
*H01L 29/66* (2006.01)

(52) U.S. Cl.
USPC .......................................... 257/197; 257/565

(58) Field of Classification Search
USPC ................. 257/197, 391, 565, 566; 438/313, 438/320
See application file for complete search history.

(56) References Cited

U.S. PATENT DOCUMENTS

| 4,794,440 | A  | * | 12/1988 | Capasso et al. | 257/191 |
|-----------|----|---|---------|----------------|---------|
| 5,010,382 | A  |   | 4/1991  | Katoh          |         |
| 5,310,690 | A  | * | 5/1994  | Bell et al.    | 438/526 |
| 2001/0017379 | A1 | * | 8/2001 | Tsai et al.   | 257/197 |
| 2006/0236923 | A1 | * | 10/2006 | Kouvetakis et al. | 117/108 |
| 2006/0249797 | A1 | * | 11/2006 | Nakazawa et al. | 257/378 |
| 2007/0052066 | A1 | * | 3/2007  | Beasom         | 257/565 |
| 2008/0116488 | A1 | * | 5/2008  | Shim et al.    | 257/197 |
| 2008/0121930 | A1 | * | 5/2008  | Adam et al.    | 257/190 |

OTHER PUBLICATIONS

International Search Report and Written Opinion dated Jul. 12, 2010 for related PCT Application No. PCT/US2010/030367.

* cited by examiner

*Primary Examiner* — N Drew Richards
*Assistant Examiner* — Christina Sylvia
(74) *Attorney, Agent, or Firm* — Dustin B. Weeks, Esq.; Ryan A. Schneider, Esq.; Troutman Sanders LLP

(57) ABSTRACT

Superjunction collectors for transistors are discussed in this application. According to one embodiment, a bipolar transistor having a superjunction collector structure can comprise a collector electrode, a base electrode, an emitter electrode, a collector-base space charge region, and a superjunction collector. The collector-base space charge region can be disposed in electrical communication between the collector electrode and the base electrode. The superjunction collector region can be disposed in the collector-base space charge region. The superjunction collector region can comprise a plurality of alternating horizontally disposed P-type and N-type layers. The layers can be horizontally disposed layers that are layered on top of each other. The P-type and N-type layers can be doped with different types of doping levels. Other aspects, embodiments, and features are also discussed and claimed.

27 Claims, 4 Drawing Sheets

SUPERJUNCTION COLLECTORS FOR TRANSISTORS AND SEMICONDUCTOR DEVICES

CROSS REFERENCE TO RELATED APPLICATION & PRIORITY CLAIM

This patent application is a 35 U.S.C §371 United States National Stage Application of International Appliation No. PCT/US2010/030367, filed 8 Apr. 2010, which claims priority to and the benefit of U.S. Provisional Application No. 61/168,017, filed 9 Apr. 2009, and entitled "A Superjunction Collector Design for Improving Speed and Breakdown Voltage Tradeoff in High-Speed Bipolar Transistors," the contents of which are incorporated herein by reference in their entirety as if fully set forth below.

TECHNICAL FIELD

Embodiments of the present invention relate generally to semiconductor devices and fabrication of semiconductor devices, and more particularly, to providing improved transistors with superjunction collector features.

BACKGROUND

There has been growing markets for high-frequency applications such as mm-wave radars; multi-Gb/s WLANs; 100 Gb/s Ethernet; and THz-imaging systems. The operation frequency of these applications ranges from 10 GHz to 1 THz, and high-speed bipolar transistors (such as InP DHBTs), especially using low-cost silicon-based IC platforms such as SiGe HBTs, are essential in realizing these applications.

There exists, however, a fundamental tradeoff between the device cutoff frequency ($f_T$) and breakdown voltage (e.g., the collector-emitter breakdown voltage with the base open ($BV_{CEO}$) and the collector-base breakdown voltage with the emitter open ($BV_{CBO}$)). Normally higher $f_T$ can be achieved by increasing the doping level of the selectively implanted collector (SIC) region. In this way, the collector-base (CB) space charge region (SCR) shrinks, giving rise to lower carrier transit time. However, such method degrades the impact ionization within the CB SCR, causing higher multiplication factors (M−1) and lower breakdown voltages ($BV_{CEO}$ and $BV_{CBO}$), which can potentially compromise both the RF output power and the signal-to-noise ratio of such systems. Such issue has already become critical in the highly-scaled SiGe HBTs, whose $f_T$ and maximum oscillation frequency ($f_{max}$) have well exceeded 100 GHz regime. Recent research bodes well for further scaling toward half-terahertz (500+GHz) performance at room temperature. In pursuit of higher $BV_{CEO}$ with little degradation in the ac performance, device engineers have had to sacrifice half of the dc current gain ($\beta$) for about 0.1 V increase in $BV_{CEO}$.

What is needed, therefore, are improved semiconductor and transistor devices that include features such as improved avalanche breakdown behavior without adversely impacting device speed. Embodiments of the present invention are directed to such semiconductor and transistor devices.

SUMMARY OF EXEMPLARY EMBODIMENTS

Embodiments of the present invention include both transistors and semiconductor devices incorporating novel superjunction collector designs. According to some sample embodiments, a superjunction collector can be utilized to significantly improve avalanche breakdown behavior of SiGe high-speed bi-polar transistors (sometime abbreviated as HBTs) with little or no impact on device speed. Still yet some embodiments can be used to provide a SiGe HBT with operational performance characteristics including 100 GHz peak $f_T$ and 3.0 V $BV_{CEO}$. Embodiments of the present invention generally include features that introduce abrupt PN/NP junctions into committer-base (CB) space charge region (SCR) and alters the CB electric field shape without changing the SCR width.

According to some embodiments, the present invention includes transistors that have a superjunction collector structure (e.g., a bipolar transistor). Such transistors can generally comprise a collector electrode, a base electrode, an emitter electrode, a collector-base space charge region, and a superjunction collector region. The collector-base space charge region can be disposed in electrical communication between the collector electrode and the base electrode. The superjunction collector region can be disposed in the collector-base space charge region. The superjunction collector region can comprise a plurality of alternating horizontally disposed P-type and N-type layers. The horizontally disposed layers can be layered on top of each other to form a vertical stack. The P-type and N-type layers can be doped with different types of doping levels. The layers in the superjunction collector region in concert can form a vertical column superjunction collector that is positioned vertical relative to a subcollector region and a base region. The horizontally disposed layers can define a plurality of abrupt transition regions within the superjunction collector region.

Transistor devices can also comprise additional features according to embodiments of the present invention. For example, transistors can have an operational frequency ranging from about 10 GHz to about 500 GHz. Also transistors can have an operational voltage range from less than 1 V to about 20 V. Also the collector and base can define a collector-base space charge region associated with the transistor and the collector-base space charge region can have an area ranging from about 50 nm to about 500 nm. At least a portion of the horizontally disposed P-type and N-type layers can have varied doping levels across their widths. Some of the horizontally disposed P-type and N-type layers can have increased doping levels at one end of the horizontal layers relative to the other end. And some of the horizontally disposed P-type and N-type layers form a layer pair that comprises at least one P-type layer and at least one N-type layer, and an electric field associated with the layer pair is increased within the pair relative to an electric field outside the layer pair. Transistor devices can be silicon-based transistors configured as at least one of a Si bipolar-homojunction transistor, a heterojunction bipolar transistor, and a III-V bipolar transistor. Also transistors can comprise at least one of Si, Ge, C, In, Al, Ga, and As, or a combination thereof.

Some devices according to the present invention can be implemented as a high-speed semiconductor-transistor device that operates at low voltages. These devices can generally comprise a collector portion, a base portion, an emitter portion, a superjunction collector region disposed between the collector portion and the base portion. The superjunction collector region within the device can be configured to comprise multiple layers, such as a first, second, third, and a fourth layer. The first layer can be a semiconductor material that has a Type-I doping, and the second layer can be a semiconductor material that has a Type-II doping. The first layer and the second layer can form a first layer pair. The third layer can be a semiconductor material that has a Type-I doping, and the fourth layer can be a semiconductor material that has a Type-II doping. The third layer and the fourth layer can form a second layer pair. The first layer pair and the second layer pair can form a vertical column. The vertical column can comprise the layers as horizontal layers and an interface between the first layer pair and the second layer pair can define an abrupt transition zone.

Superjunction collector regions used in high-speed transistor devices can also have additional features. For example, the doping levels of the first, second, third, and fourth layers vary across the width of the layers. Also superjunction collector regions can comprise a third layer pair disposed within the vertical column that interfaces with the first layer pair or second layer to define a second abrupt transition zone. The collector and base can define a collector-base space charge region in which the superjunction collector region is disposed. The collector-base space charge region can have an area that ranges from about 50 nm to about 500 nm.

Embodiments of the present invention can also include device fabrication methods. For example, methods can include fabrication of a bipolar transistor having a superjunction collector structure. The method can comprise providing a collector electrode, a base electrode, and an emitter electrode. The method can also include providing a collector-base space charge region disposed in electrical communication between the collector electrode and the base electrode. The method can also include providing a superjunction collector region disposed in the collector-base space charge region to have a plurality of alternating horizontally disposed P-type and N-type layers such that the horizontally disposed layers are layered on top of each other. Still yet method embodiments can also include doping the P-type and N-type layers with different types of doping levels.

Method embodiments can also include additional features. For example, a method can include configuring horizontally disposed layers to form a vertically-shaped superjunction collector that is positioned vertical relative to a subcollector region and a base region. Methods can also include providing horizontally disposed layers to define a plurality of abrupt transition regions within the superjunction collector region. Some methods can include fabricating the superjunction collector region via an epitaxially-grown structure or via ion implantation combined with laser annealing. Still yet some embodiments can include configuring the transistor as a silicon-based transistor, a Si bipolar-homojunction transistor, a heterojunction bipolar transistor, and a III-V bipolar transistor, and fabricating the transistor with at least one of Si, Ge, C, In, Al, Ga, and As, or a combination thereof.

Still yet, embodiments of the present invention can be a semiconductor device that incorporates high-speed bi-polar transistors that include superjunction collector regions. At least one of the transistors in the semiconductor device can comprise a collector-base space charge region disposed in electrical communication between a collector part and a base part, and a superjunction collector region disposed in the collector-base space charge region. The superjunction collector region can comprise a plurality of alternating horizontally disposed layers such that the horizontally disposed layers are layered on top of each other. The layers can define at least a first layer pair and a second layer pair. The first layer pair and the second layer pair can form a vertical column that comprises the layers as horizontal layers. An interface between the first layer pair and the second layer pair define an abrupt transition zone.

Semiconductor devices/transistors having superjunction collector regions can also include other features. As an example, a first layer pair and a second layer pair can each comprise first and second semiconductor layers that have differing doping levels. Devices can have an operational voltage range of about 1 Volt to about 20 Volts. Doping levels of the first layer pair and the second layer pair can vary across the width of the vertical column. Devices can have an operational frequency ranging from about 10 GHz to about 500 GHz. Also, the plurality of alternating horizontally disposed layers can have varied doping levels across the vertical column defined by the layers. In addition, the plurality of alternating horizontally disposed layers can have varied lengths across the vertical column defined by the layers.

Other aspects and features of embodiments of the present invention will become apparent to those of ordinary skill in the art, upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments it is to be understood that such exemplary embodiments can be implemented in various systems, and methods.

DETAILED DESCRIPTION OF PREFERRED & ALTERNATIVE EMBODIMENTS

To facilitate an understanding of the principles and features of the various embodiments of the invention, various illustrative embodiments are explained below. As will be explained below, embodiments of the present invention provide improved and advantageous semiconductor and transistor devices. Advantageously, embodiments of the present invention enable high-speed devices that lack negative performance factors so that devices according to embodiments of the present invention can be used in high-speed applications (e.g., 10 GHz to 500 GHz).

Figure 1:
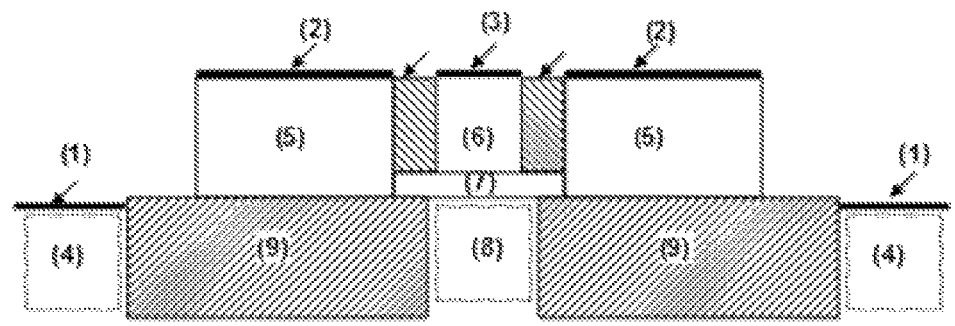
FIG. 1 illustrates a block diagram of a cross section of a high-speed bipolar transistor that includes a standard collector.

Turning now to the figures wherein, FIG. 1 illustrates a block diagram of a cross section of a high-speed bipolar transistor 100 that includes a standard collector 8. The transistor also includes a collector contact 1, a base contact 2, an emitter contact 3, a semiconductor collector contact region 4, a semiconductor extrinsic base region 5, a semiconductor emitter region 6, a semiconductor intrinsic base region 7, oxide regions 9, a subcollector 10, a semiconductor substrate 11, and a substrate contact 12. The transistor 100 can be configured as a stand-alone device on its own substrate, integrated with other semiconductor devices on the same substrate, or disposed within an integrated circuit with other devices.

As mentioned above, the transistor 100 includes the standard collector 8. The standard collector 8 while enabling the transistor 100 to function limits the performance of the transistor 100. The transistor 100 is limited by its breakdown voltage and as a result has a device speed trade-off. For example, a typical commercial 100-GHz SiGe HBT cannot exceed a $BV_{CEO}$ of 2.4 V. Therefore, it cannot be applied to applications where both higher speed and higher breakdown voltage are required simultaneously. Both output power and operation frequency are thus limited in the transistor 100. To address the drawbacks associated with transistor 100, the inventors have designed an improved transistor design.

Figure 2:
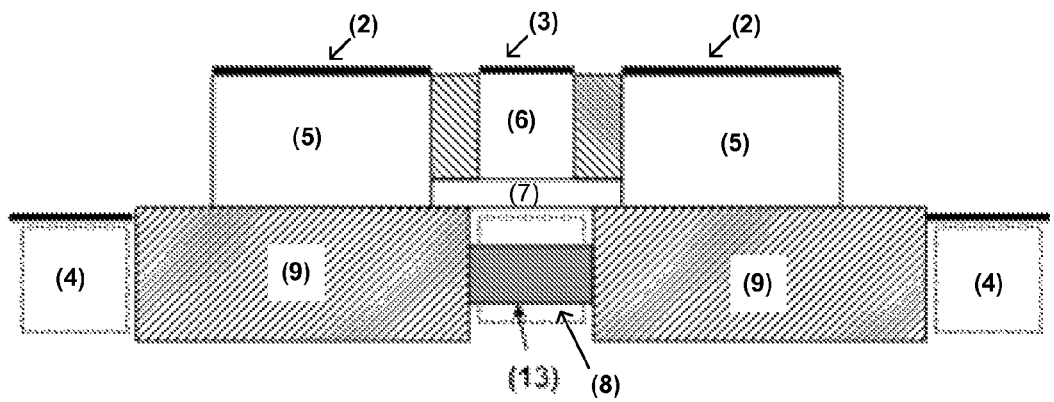
FIG. 2 illustrates a block diagram of a cross section of a high-speed bipolar transistor that comprises a superjunction collector in accordance with some embodiments of the present invention.

FIG. 2 illustrates a block diagram of a cross section of an improved high-speed bipolar transistor 200. The transistor can comprises a superjunction collector 205 in accordance with some embodiments of the present invention. The transistor 200 is an improved device relative to transistor 100, and as shown, the high-speed bipolar transistor 200 is a vertical structure. The transistor 200 can have components similar to those shown in FIG. 1 so for brevity those components are not discussed again. This enables discussion to focus on the superjunction collector 13 forming part of transistor 200. As shown the superjunction collector 13 can be disposed in a collector-base space charge region disposed in electrical communication between the collector electrode and the base electrode.

The superjunction collector 13 can have additional features. For example, the superjunction collector can comprise multiple layers of alternating opposite doping. The layers can have a thickness ranging from approximately 5 nm to 500 nm, lengths ranging from the same values as transistor physical length, and widths ranging from the same values as transistor physical width. The layers can be made of the same materials as a standard transistor collector, and doped with alternating high concentrations of P-type or N-type dopants. In some embodiments, the doping polarity could be reversed to be compatible with either n-p-n or p-n-p transistors. The superjunction collector 13 can be placed in the SIC region of the transistor 200. The multiple layers of the superjunction collector can be stacked on each other in a horizontal fashion to form a vertical column or vertical stack. The layers can be doped at differing levels (e.g., ranging from $1\times10^{16}$ to $1\times10^{19}$ cm$^{-3}$) depending on the level of the background SIC doping, usually in the range of 1.2 to 5 times of the background SIC doping level of the transistor in question. The doping levels of those superjunction layers are preferably high enough to reshape the electric field in the CB SCR. The layers can have varied doping levels across their widths. The layers can have varied doping levels depending upon their location in the vertical stack. The layers can also be grouped together with a respective layer to form a layer pair. By providing the multiple layers to form the superjunction collector 13, the design keeps charge region area minimal while enabling the electric field in the region to be altered (relative to standard collector design). If multiple layer pairs are desired in the superjunction collector 13, each layer pair may have the same or different amount of doping as another layer pair.

Figure 3:
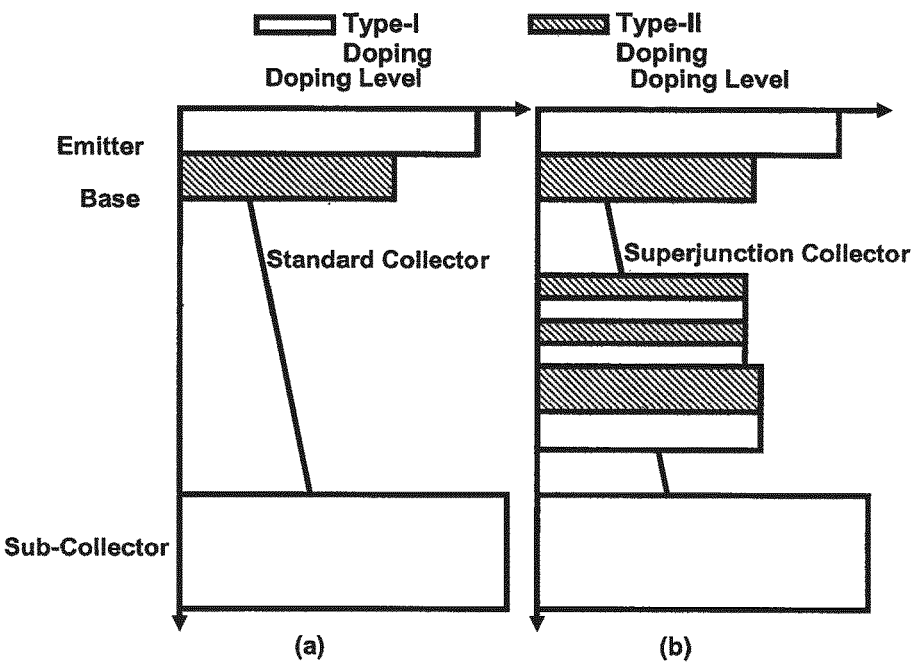
FIG. 3 graphically depicts varied doping levels as a function of device depth of a transistor with a standard collector and a superjunction collector fabricated in accordance with some embodiments of the present invention.

FIG. 3 graphically depicts varied doping levels as a function of device depth of a transistor with a standard collector and a superjunction collector 300 fabricated in accordance with some embodiments of the present invention. As shown, the superjunction collector 300 includes a number of horizontal layers stacked on each other to form a vertical column. The vertical column is disposed between the sub-collector and the base/emitter portions. The layers of the vertical column can have differing thicknesses and widths. The layers can also have varied doping across their lengths as shown by the Doping Level axis in FIG. 3. As should be understood, Type-I and Type-II can be varying amounts of P or N type doping as may be desired. In some embodiments, Type-I may be P-type doping and Type-II may be N-type doping (or vice versa). FIG. 3 also shows that layers can be grouped together to form layer pairs.

Figure 4:
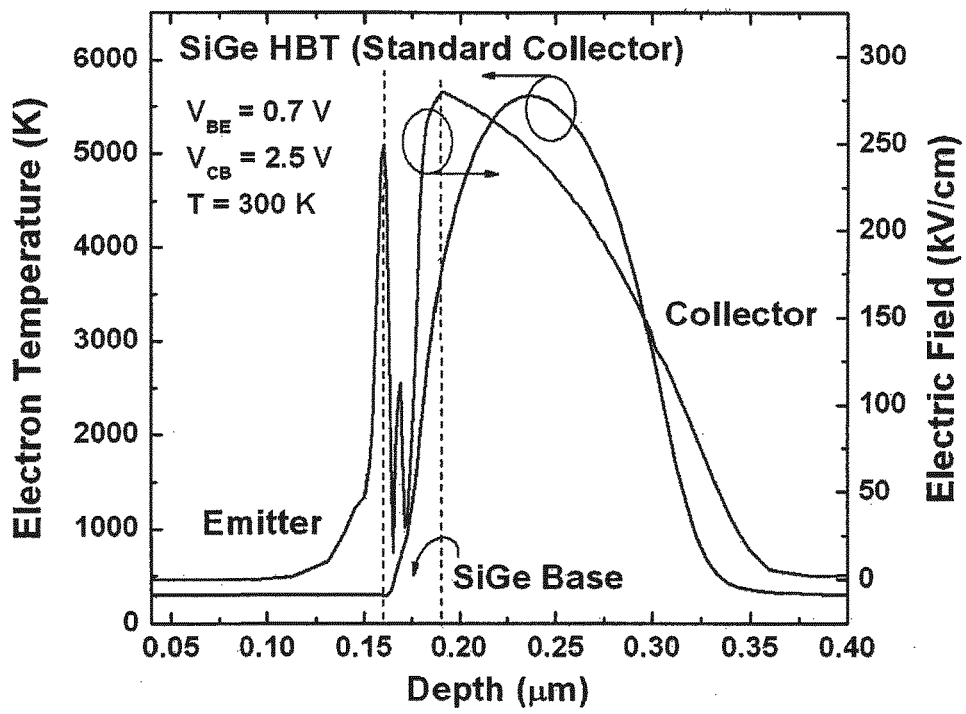
FIG. 4 graphically depicts simulated electron temperature and electric field in a SiGe HBT with a standard collector.
Figure 5:
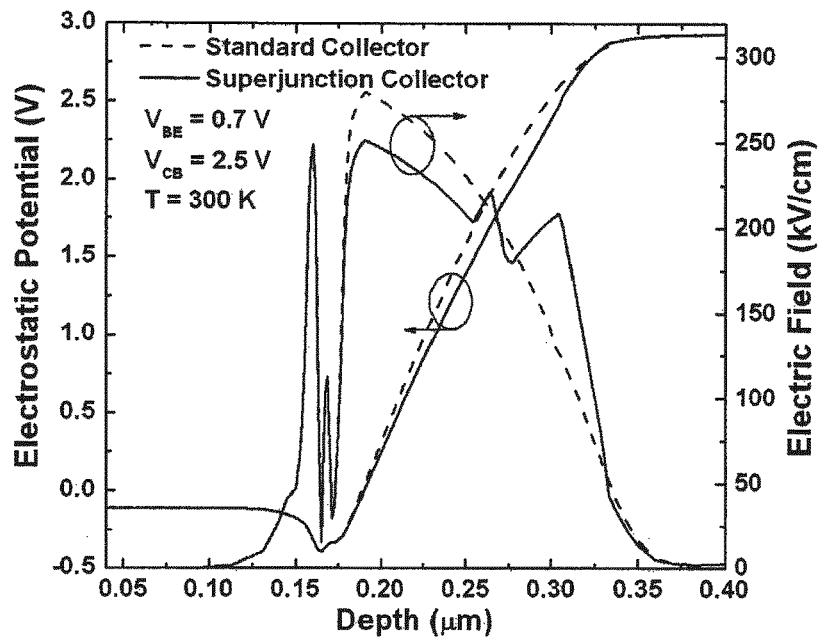
FIG. 5 graphically depicts a comparison of electrostatic potential and electric field of a standard collector with that of a superjunction collector fabricated in accordance with some embodiments of the present invention.
Figure 6:
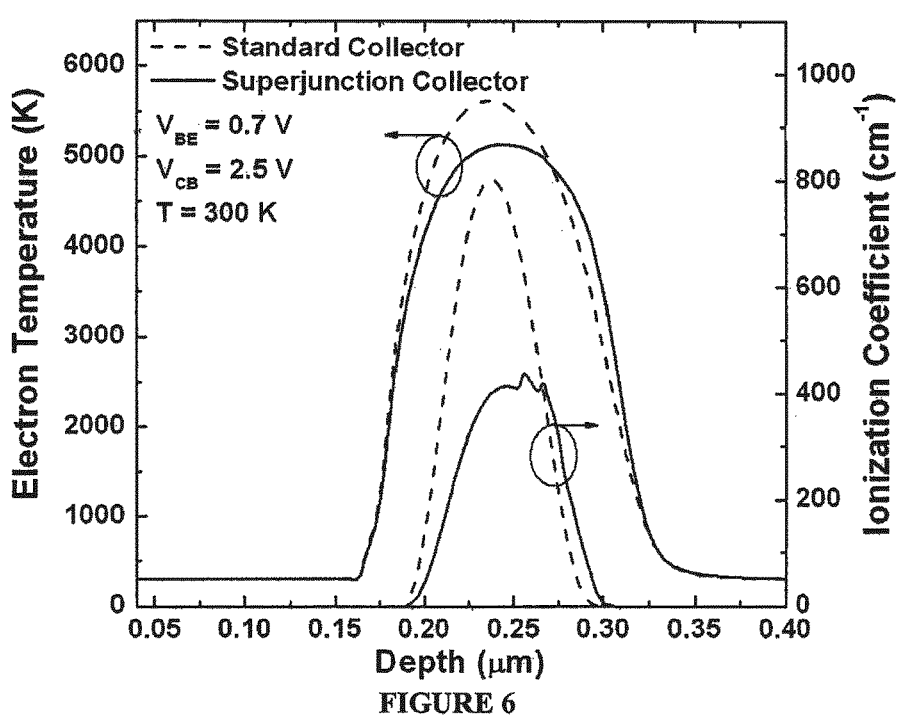
FIG. 6 graphically depicts a comparison of electron temperature and ionization coefficient of a standard collector with that of a superjunction collector fabricated in accordance with some embodiments of the present invention.
Figure 7:
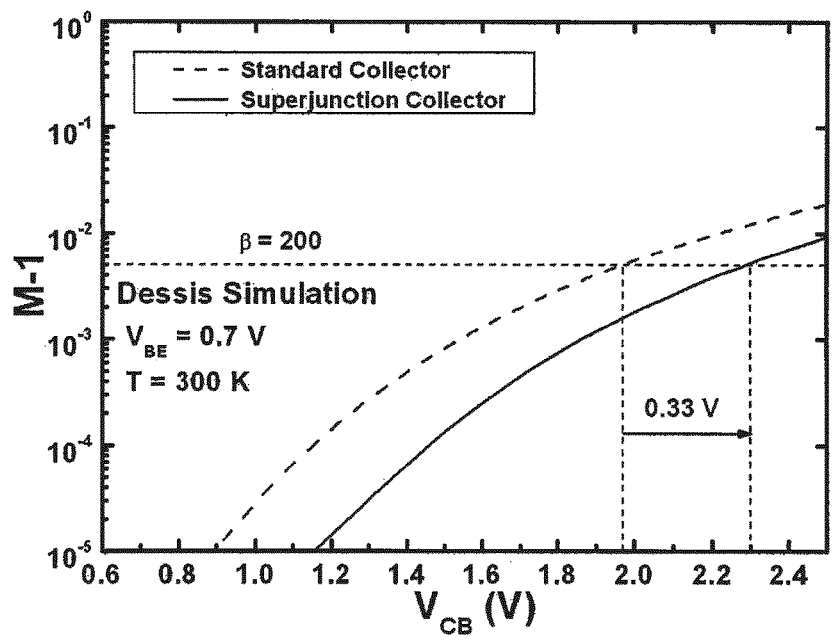
FIG. 7 graphically depicts a simulated multiplication factor for a standard collector and a superjunction collector fabricated in accordance with some embodiments of the present invention.
Figure 8:
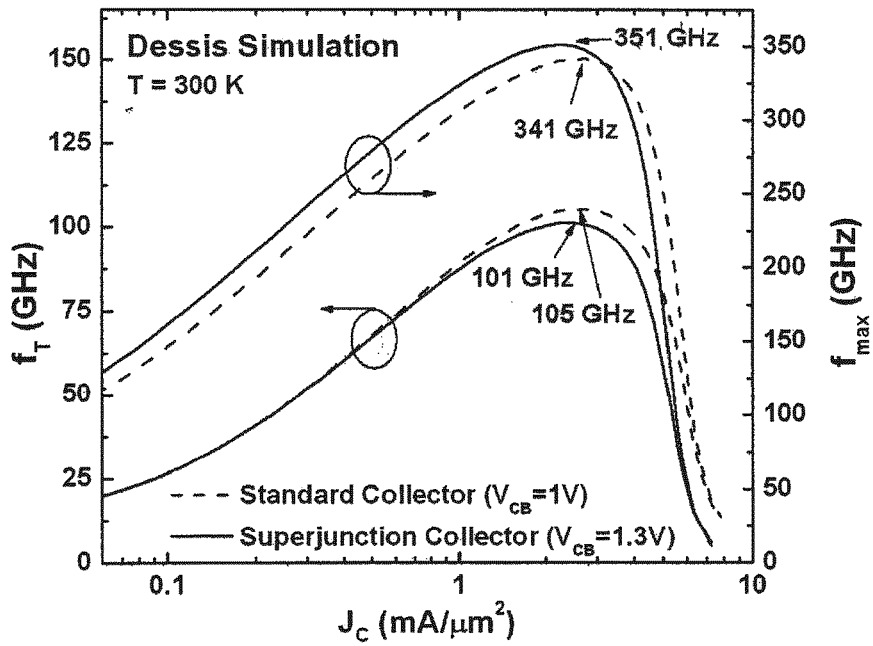
FIG. 8 graphically depicts a comparison of cutoff frequency of a standard collector with that of a superjunction collector fabricated in accordance with some embodiments of the present invention.

The inventors have simulated various designs and provide figures showing simulation results. FIG. 4 graphically depicts simulated electron temperature and electric field in a SiGe HBT with a standard collector. FIG. 5 graphically depicts a comparison of electrostatic potential and electric field of a standard collector with that of a superjunction collector fabricated in accordance with some embodiments of the present invention. FIG. 6 graphically depicts a comparison of electron temperature and ionization coefficient of a standard collector with that of a superjunction collector fabricated in accordance with some embodiments of the present invention. FIG. 7 graphically depicts a simulated multiplication factor for a standard collector and a superjunction collector fabricated in accordance with some embodiments of the present invention. FIG. 8 graphically depicts a comparison of cutoff frequency of a standard collector with that of a superjunction collector fabricated in accordance with some embodiments of the present invention. These figures will be discussed in additional detail below.

Due to non-local impact ionization, there is a dead zone between the peaks of the electron temperature ($T_n$) and the electric field of a bipolar transistor with a standard collector (FIG. 4). According to some embodiments, the starting point of superjunction should be placed from around the position where the electron temperature peaks. This will increase the electric field in deep into the CB SCR, causing more voltage drop in those low-$T_n$ regions. In this way, the peak electric field at the CB metallurgic junction can be suppressed, and avalanche is significantly decreased due to near-exponential dependence of the ionization coefficient on $T_n$.

Since no net total charge is put into the CB depletion region, (the p and n-doping cancel out), the superjunction does not change the width of the CB SCR. Consequently, it has little influence on device speed. In other words, the device speed can be greatly enhanced for a given $BV_{CEO}$ or $BV_{CBO}$.

As an example, a standard collector design leads to $f_T$=105 GHz, $f_{max}$=351 GHz, and $BV_{CEO}$=2.67 V in a prototype SiGe HBT. Now two abrupt PN junctions (a superjunction) are carefully designed and placed into the CB SCR of this SiGe HBT. The higher electric field induced by the superjunction shifts more voltage drop deeper into CB SCR, as evidenced by the lower electric field (smaller slope of the electrostatic potential) near the CB metallurgical junction, and the higher electric field (steeper slope of the electrostatic potential) in the deep CB SCR (FIG. 5). Consequently, the lower peak electric field decreases the peak $T_n$ by 10% (FIG. 6). The peak impact ionization coefficient is nearly halved in the superjunction collector design, as shown in FIG. 6. The resultant M−1 is decreased by almost an order of magnitude at fixed $V_{CB}$, and, therefore, $BV_{CEO}$ improves by 0.33 V (FIG. 7), a 12% increase over the standard collector design, and clearly of significance to circuit designers. Choosing β=200, $BV_{CEO}$ reaches 3.0 V.

Despite the significant higher $BV_{CEO}$, little degradation can be observed in the ac performance, as shown in FIG. 7, where the minor $f_T$ degradation (<4%) is caused by the more severe heterojunction barrier effect in the new collector design owing to the smaller voltage drop near the CB metallurgical junction. This small degradation occurs at peak-$f_T$ current density and above and is thus not important for most circuit applications. In addition, with higher operating voltage, the higher $V_{CB}$ of the new design decreases the CB capacitance, which in turn enhances peak $f_{max}$ by about 10 GHz.

This novel superjunction collector SiGe HBT can improve the state-of-the-art by improving trade-off between $f_T$ and $BV_{CEO}$, breaking the physical limit of conventional profile optimization of the SIC doping. The new superjunction collector can break this barrier, achieving a device with: $f_T$=101 GHz, $f_{max}$=351 GHz, and $BV_{CEO}$=3.0 V (at 130 nm).

Embodiments of the present invention may be fabricated using a fully epitaxially-grown structure, or possibly by using ion implantation combined with laser annealing. This superjunction collector design can potentially be applied to all epi-base bipolar transistors to achieve improved breakdown voltage without performance loss.

It should be understood that embodiments of the present invention are significantly different from that convention superjunction techniques. Superjunction techniques have been historically employed in the body or substrate of semiconductor power devices to improve the breakdown voltage/on-state resistance ($R_{on}$) tradeoff. While enabling a high doping level to reduce $R_{on}$, such a superjunction in a high-power device maintains an SCR that is wide enough to sustain a bias of more than 50 V. Embodiments described herein are, for example, designed for use in high-speed SiGe HBTs and enable the $T_n$ profile while preserving the minimum CB SCR width, and thus maintaining high speed operation.

In known conventional high-speed devices, an i-p+ layer has been inserted between base and collector of a GaAs HBT to form an inverted field. This is done to prevent electrons from moving out of the Γ-valley. In this way, inter-valley scattering is minimized and near-ballistic transport of electrons can be achieved. Such a structure was designed to utilize velocity overshoot in GaAs, however, and hence, cannot be applied to Si-based bipolar transistors. In fact, such an i-p+ layer located between the base and collector regions would degrade the frequency response of a SiGe HBT because of the increased effective base transit time.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof. Indeed, the above descriptions are exemplary and yet other features and embodiments exist.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. A transistor having a superjunction collector structure, the transistor comprising:

a collector electrode, a base electrode, and an emitter electrode;

a collector-base space charge region disposed in electrical communication between the collector electrode and the base electrode; and a superjunction collector region disposed in the collector-base space charge region, the superjunction collector region comprising a plurality of alternating horizontally disposed P-type and N-type layers such that the horizontally disposed layers are layered on top of each other, wherein the P-type and N-type layers are doped with different types of doping levels, wherein the horizontally disposed layers in the superjunction collector region in concert form a vertical column superjunction collector that is positioned vertical relative to a subcollector region and a base region, wherein each of the plurality of horizontally disposed layers in the superjunction collector have a doping concentration between $10^{16}$ cm$^{-3}$ and $10^{19}$ cm$^{-3}$ and a thickness between 5 nm and 500 nm.

2. The transistor of claim 1, wherein the horizontally disposed layers define a plurality of abrupt transition regions within the superjunction collector region.

3. The transistor of claim 1, wherein the transistor has an operational frequency ranging from about 10 GHz to about 500 GHz.

4. The transistor of claim 1, wherein the transistor has an operational voltage range from less than 1 V to about 20 V.

5. The transistor of claim 1, wherein the collector and base define the collector-base space charge region associated with the transistor and the collector-base space charge region has an area ranging from about 50 nm to about 500 nm.

6. The transistor of claim 1, wherein at least a portion of the horizontally disposed P-type and N-type layers have varied doping levels across their widths.

7. The transistor of claim 1, wherein at least a portion of the horizontally disposed P-type and N-type layers have increased doping at one end of the horizontal layers relative to the other end.

8. The transistor of claim 1, wherein at least a portion of the horizontally disposed P-type and N-type layers form a layer pair that comprises at least one P-type layer and at least one N-type layer, and wherein an electric field associated with the layer pair is increased within the pair relative to an electric field outside the layer pair.

9. The transistor of claim 1, wherein the transistor is a silicon-based transistor configured as at least one of a Si bipoloar-homojunction transistors, a heterojunction bipolar transistors, and a III-V bipolar transistors.

10. The transistor of claim 1, wherein the transistor comprises at least one of Si, Ge, C, In, Al, Ga, and As, or a combination thereof.

11. In a high-speed semiconductor-transistor device that operates at low voltages that comprises a collector portion, a base portion, an emitter portion, wherein the base portion and the emitter portion are vertically-aligned together such that the emitter portion is positioned above the base portion, the semiconductor-transistor device further comprising a superjunction collector region disposed between the collector portion and the base portion and below the base portion, the superjunction collector region within the device being configured to comprise:
- a first layer of a semiconductor material that has a Type-I doping and a second layer of a semiconductor material that has a Type-II doping, the first layer and the second layer forming a first layer pair;
- a third layer of a semiconductor material that has a Type-I doping and a fourth layer of a semiconductor material that has a Type-II doping, the third layer and the fourth layer forming a second layer pair; and
- wherein the first layer pair and the second layer pair form a vertical column that comprises the layers as horizontal layers relative to the vertically-aligned base portion and emitter portion, and wherein an interface between the first layer pair and the second layer pair defines an abrupt transition zone; and
- wherein each of the first layer, second layer, third layer, and fourth layer has a doping concentration between $10^{16}$ cm$^{-3}$ and $10^{19}$ cm$^{-3}$ and a thickness between 5 nm and 500 nm.

12. The high-speed semiconductor-transistor device of claim 11, wherein the doping levels of the first, second, third, and fourth layers vary across the width of layers.

13. The high-speed semiconductor-transistor device of claim 11, further comprising a third layer pair disposed within the vertical column that interfaces with the first layer pair or second layer to define a second abrupt transition zone.

14. The high-speed semiconductor-transistor device of claim 11, wherein the collector and base define a collector-base space charge region in which the superjunction collector region is disposed.

15. The high-speed semiconductor-transistor device of claim 11, wherein the collector-base space charge region has an area that ranges from about 50 nm to about 500 nm.

16. A method to fabricate a bipolar transistor having a superjunction collector structure, the method comprising:
- providing a collector electrode, a base electrode, and an emitter electrode;
- providing a collector-base space charge region disposed in electrical communication between the collector electrode and the base electrode;
- providing a superjunction collector region disposed in the collector-base space charge region to have a plurality of alternating horizontally disposed P-type and N-type layers such that the horizontally disposed layers are layered on top of each other, wherein each of the plurality of horizontally disposed layers has a doping concentration between $10^{16}$ cm$^{-3}$ and $10^{19}$ cm$^{-3}$ and a thickness between 5 nm and 500 nm;
- doping the P-type and N-type layers with different types of doping levels; and
- configuring the horizontally disposed layers to form a vertically-shaped superjunction collector that is positioned vertical relative to a subcollector region and a base region.

17. The method of claim 16, further comprising providing the horizontally disposed layers to define a plurality of abrupt transition regions within the superjunction collector region.

18. The method of claim 16, wherein the superjunction collector is fabricated via an epitaxially-grown structure.

19. The method of claim 16, further comprising configuring the transistor as a silicon-based transistor, a Si bipolar-homojunction transistor, a heterojunction bipolar transistor, and a III-V bipolar transistor, and fabricating the transistor with at least one of Si, Ge, C, In, Al, Ga, and As, or a combination thereof.

20. A semiconductor device that incorporates high-speed bipolar transistors that includes superjunction collector regions, wherein at least one of the transistors in the semiconductor device comprises:
- an emitter part, a base part, and a collector part, wherein the emitter part and the base part are vertically-aligned such that the emitter part is positioned above the base part;
- a collector-base space charge region disposed in electrical communication between a collector part and a base part and positioned below the base part; and
- a superjunction collector region disposed in the collector-base space charge region, the superjunction collector region comprising a plurality of alternating horizontally disposed layers relative to the vertically-aligned base part and emitter part, such that the horizontally disposed layers are layered on top of each other, wherein the layers define at least a first layer pair and a second layer pair, wherein each of the plurality of horizontally disposed layers in the superjunction collector region have a doping concentration between $10^{16}$ cm$^{-3}$ and $10^{19}$ cm$^{-3}$ and a thickness between 5 nm and 500 nm; and
- the first layer pair and the second layer pair form a vertical column that comprises the layers as horizontal layers and wherein an interface between the first layer pair and the second layer pair define an abrupt transition zone.

21. The at least one transistor of claim 20, wherein the first layer pair and the second layer pair each comprise first and second semiconductor layers that have differing doping levels.

22. The at least one transistor of claim 20, wherein the transistor has an operational voltage range of about 1 Volt to about 20 Volts.

23. The at least one transistor of claim 20, wherein the doping levels of the first layer pair and the second layer pair vary across the width of the vertical column.

24. The at least one transistor of claim 20, wherein the transistor has an operational frequency ranging from about 10 GHz to about 500 GHz.

25. The at least one transistor of claim 20, wherein the plurality of alternating horizontally disposed layers have varied doping levels across the vertical column defined by the layers.

26. The at least one transistor of claim 20, wherein the plurality of alternating horizontally disposed layers have varied lengths across the vertical column defined by the layers.

27. The method of claim 16, wherein the superjunction collector is fabricated via ion implantation combined with laser annealing.

* * * * *